(12) United States Patent
Lee et al.

(10) Patent No.: US 11,437,356 B2
(45) Date of Patent: Sep. 6, 2022

(54) DISPLAY MODULE AND DISPLAY APPARATUS HAVING THE SAME

(71) Applicant: SAMSUNG ELECTRONICS CO., LTD., Suwon-si (KR)

(72) Inventors: Dongyeob Lee, Suwon-si (KR); Doyoung Kwag, Suwon-si (KR); Sangmoo Park, Suwon-si (KR); Seona Yang, Seoul (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 16 days.

(21) Appl. No.: 16/998,118

(22) Filed: Aug. 20, 2020

(65) Prior Publication Data
US 2021/0057401 A1  Feb. 25, 2021

(30) Foreign Application Priority Data
Aug. 20, 2019 (KR) .................. 10-2019-0101633

(51) Int. Cl.
| | |
|---|---|
| *H01L 31/036* | (2006.01) |
| *H01L 29/15* | (2006.01) |
| *H01L 29/04* | (2006.01) |
| *H01L 27/14* | (2006.01) |
| *H01L 25/16* | (2006.01) |

(52) U.S. Cl.
CPC .................................. *H01L 25/167* (2013.01)

(58) Field of Classification Search
CPC ... H01L 25/167; H01L 33/62; H01L 25/0753; H01L 27/156; H01L 27/1218; H01L 27/124; H01L 27/1262
See application file for complete search history.

(56) References Cited

U.S. PATENT DOCUMENTS

| | | |
|---|---|---|
| 9,935,131 B2 | 4/2018 | Lv et al. |
| 2015/0187807 A1 | 7/2015 | Tsuruoka et al. |

(Continued)

FOREIGN PATENT DOCUMENTS

| | | |
|---|---|---|
| CN | 109904080 A | 6/2019 |
| JP | 6176117 B2 | 8/2017 |

(Continued)

OTHER PUBLICATIONS

Communication dated Nov. 16, 2020, issued by the European Patent Office in European Application No. 20188778.3.

*Primary Examiner* — Ismail A Muse
(74) *Attorney, Agent, or Firm* — Sughrue Mion, PLLC

(57) ABSTRACT

A display module is provided. The display module includes a substrate including a thin film transistor (TFT) layer including a plurality of TFTs, a plurality of light emitting diodes (LEDs) arranged on a front surface of the substrate, each LED corresponding to a respective TFT, and an operation driver that is connected to a rear surface of the substrate and controls an operation of the TFTs. The substrate includes a plurality of first via holes extending in a vertical direction from the front surface of the substrate to the rear surface of the substrate. The first via holes are filled with conductive materials and are distributively arranged based on at least one of the columns or rows of the plurality of LEDs. The first via holes connect the TFTs to the operation driver.

17 Claims, 14 Drawing Sheets

(56) References Cited

U.S. PATENT DOCUMENTS

| | | |
|---|---|---|
| 2017/0194505 A1 | 7/2017 | Cho et al. |
| 2018/0083218 A1* | 3/2018 | Choi .................... H01L 51/5275 |
| 2018/0114508 A1* | 4/2018 | Cho ...................... G06F 3/1446 |
| 2018/0196326 A1 | 7/2018 | Paolini, Jr. et al. |
| 2020/0161405 A1 | 5/2020 | Kim et al. |
| 2020/0280796 A1* | 9/2020 | Lee .......................... H04R 1/26 |
| 2021/0005796 A1* | 1/2021 | Min .................... H01L 25/0753 |
| 2021/0225901 A1* | 7/2021 | Luo ......................... H01L 27/32 |

FOREIGN PATENT DOCUMENTS

| | | |
|---|---|---|
| KR | 1020200057198 A | 5/2020 |
| WO | 2020187107 A1 | 9/2020 |

\* cited by examiner

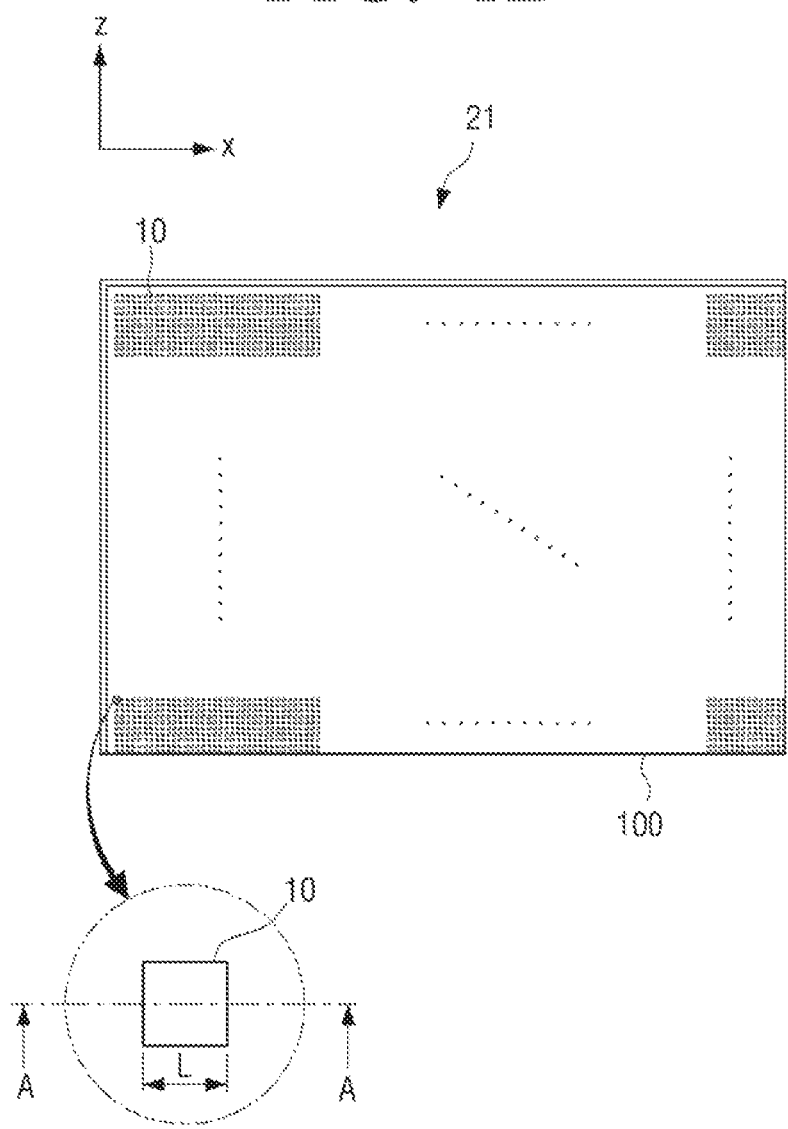

DISPLAY MODULE AND DISPLAY APPARATUS HAVING THE SAME

CROSS-REFERENCE TO RELATED APPLICATION(S)

This application is based on and claims priority under 35 U.S.C. § 119 to Korean Patent Application No. 10-2019-0101633, filed on Aug. 20, 2019, in the Korean Intellectual Property Office, the disclosure of which is incorporated by reference herein in its entirety.

BACKGROUND

1. Field

The disclosure relates to a display module with improved manufacturing efficiency and uniformness of operation signals, and a display apparatus having the same.

2. Description of Related Art

Light emitting diodes (LEDs) are being used widely not only as light sources for illumination apparatuses, but also as light sources for various types of display apparatuses of various electronic products such as televisions (TVs), mobile phones, personal computers (PCs), laptop PCs, personal digital assistants (PDAs), etc.

In particular, recently, micro LEDs of which short edges are smaller than or equal to 100 μm are being developed, and such micro LEDs have fast reaction speed, low power consumption, and high luminance compared to conventional LEDs, and are capable of displaying images with high resolution such as 4K, 8K, etc., even though they are small in size, and thus they are gaining popularity as light emitting diodes for next-generation displays.

LEDs are manufactured in forms of semiconductor chips on wafers, and may constitute a light emitting module of a display as they are arranged on a target substrate.

Tens of thousands of micro LEDs to tens of millions of micro LEDs may be mounted on a display module, and such a large number of micro LEDs may be controlled through operation signals transmitted from a driver.

Here, operation signals are transmitted to the micro LEDs at the same time from a driver, and accordingly, there is a problem that differences in the time and strength among operation signals applied to each micro LED occur.

A micro-luminescent diode (e.g., micro LED, mLED, or μLED) display panel is a flat display panel that includes a plurality of inorganic LEDs that are each smaller than 100 micrometers.

A micro LED display panel provides improved contrast, faster response time, and higher energy efficiency as compared to those of a liquid crystal panel that requires a back light.

Although both organic LEDs (OLEDs) and micro LEDs have high energy efficiency, micro LEDs are brighter, have improved luminous efficiency, and have a longer lifespan than OLEDs.

SUMMARY

In accordance with an aspect of the disclosure, a display module includes a substrate including a thin film transistor (TFT) layer including a plurality of TFTs; a plurality of light emitting diodes (LEDs) arranged on a front surface of the substrate, each LED from among the plurality of LEDs corresponding to a respective TFT from among the plurality of TFTs; and an operation driver that is connected with a rear surface of the substrate and controls an operation of the plurality of TFTs, wherein the substrate includes a plurality of first via holes extending in a vertical direction from the front surface of the substrate to the rear surface of the substrate, wherein the plurality of first via holes are filled with conductive materials and are distributively arranged based on at least one of the columns or rows of the plurality of LEDs, and wherein the plurality of first via holes connect the plurality of TFTs to the operation driver.

The display module may further include an operation wiring layer that is arranged on the rear surface of the substrate and that controls the operation of the plurality of TFTs through the plurality of first via holes, wherein the operation wiring layer includes a first operation wiring layer that transmits a gate voltage from the operation driver; and a second operation wiring layer that is separated from the first operation wiring layer, and that transmits a drain voltage from the operation driver.

The TFT layer may include a plurality of second via holes, wherein each second via hole from among the plurality of second via holes is electronically connected with at least one respective TFT from among the plurality of TFTs, and each second via hole from among the plurality of second via holes may be arranged at a position different from a position of a corresponding first via hole from among the plurality of first via holes on the substrate.

The TFT layer may include a wiring layer that electronically connects each first via hole from among the plurality of first via holes with a respective second via hole from among the plurality of second via holes.

Each TFT from among the plurality of TFTs may include a gate, a drain, and a source, and the plurality of second via holes may include a plurality of second gate via holes, each second gate via hole from among the plurality of second gate via holes being electronically connected with the gate of at least one respective TFT from among the plurality of TFTs; and a plurality of second drain via holes, each second drain via hole from among the plurality of second drain via holes being electronically connected with the drain of at least one respective TFT from among the plurality of TFTs, and the plurality of first via holes may include a plurality of first gate via holes, each first gate via hole from among the plurality of first gate via holes being electronically connected with a respective second gate via hole from among the plurality of second gate via holes through the wiring layer; and a plurality of first drain via holes, each first drain via hole from among the plurality of first drain via holes being electronically connected with a respective second drain via hole from among the plurality of second drain via holes through the wiring layer.

The plurality of TFTs may be arranged in a grid, and the TFT layer may include a first conductive layer connecting at least one gate of a TFT from among the plurality of TFTs with a respective second gate via hole from among the plurality of second gate via holes; and a second conductive layer connecting at least one drain of a TFT from among the plurality of TFTs with a respective second drain via hole from among the plurality of second drain via holes.

The wiring layer may include a third conductive layer electronically connecting the plurality of second gate via holes with the plurality of first gate via holes; a fourth conductive layer electronically connecting the plurality of second drain via holes with the plurality of first drain via holes; and an insulating layer arranged between the third conductive layer and the fourth conductive layer.

The first conductive layer may include a plurality of conductive gate wirings, each conductive gate wiring from among the plurality of conductive gate wirings being connected with the gate of at least one respective TFT from among the plurality of TFTs, the plurality of conductive gate wirings extending in a first direction, and the second conductive layer may include a plurality of conductive drain wirings, each conductive drain wiring from among the plurality of conductive drain wirings being connected with the drain of at least one respective TFT from among the plurality of TFTs, the plurality of conductive drain wirings extending in a second direction perpendicular to the first direction.

The plurality of TFTs may be arranged in a grid, and each second drain via hole from among the plurality of second drain via holes may be arranged in a different row of the grid from each other second drain via hole from among the plurality of second drain via holes.

The plurality of TFTs may be arranged in a grid, and each second gate via hole from among the plurality of second gate via holes may be arranged in a different column of the grid from each other second gate via hole from among the plurality of second gate via holes.

The plurality of second gate via holes may be symmetrically arranged with respect to a center of the substrate, and the plurality of second drain via holes may be symmetrically arranged with respect to the center of the substrate.

The plurality of first gate via holes may be arranged in one row on the substrate, and the plurality of second gate via holes may be arranged alternatingly on opposite sides of the one row of the plurality of first gate via holes.

The plurality of second gate via holes may be arranged such that a distance from each second gate via hole from among the plurality of second gate via holes to the one row of the plurality of first gate via holes is proportional to a distance of the second gate via hole to a center of the substrate.

The plurality of first drain via holes may be arranged in one column on the substrate, and the plurality of second drain via holes may be arranged alternatingly on opposite sides of the one column of the plurality of first drain via holes.

The plurality of second drain via holes may be arranged such that a distance from each second drain via hole from among the plurality of second drain via holes to the one column of the plurality of first drain via holes is proportional to a distance of the second drain via hole to a center of the substrate.

In accordance with an aspect of the disclosure, a display apparatus includes a plurality of display modules; a support member supporting the plurality of display modules on a rear surface of the plurality of display modules; and a housing that fixes the plurality of display modules and the support member, wherein each display module from among the plurality of display modules includes: a substrate including a thin film transistor (TFT) layer comprising a plurality of TFTs; a plurality of light emitting diodes (LEDs) forming a display area on a front surface of the substrate, each LED from among the plurality of LEDs corresponding to a respective TFT from among the plurality of TFTs; and an operation driver that is connected to a rear surface of the substrate and is configured to control an operation of the plurality of TFTs, and wherein the substrate includes a plurality of first via holes extending in a vertical direction from the front surface of the substrate to the rear surface of the substrate, wherein the plurality of first via holes are filled with conductive materials and are distributively arranged with respect to at least one of the columns or rows of the plurality of LEDs, and the plurality of first via holes connecting the plurality of TFTs to the operation driver.

The display apparatus may further include an operation wiring layer that is arranged on the rear surface of the substrate and that controls the operation of the plurality of TFTs through the plurality of first via holes, wherein the operation wiring layer includes a first operation wiring layer that transmits a gate voltage from the operation driver; and a second operation wiring layer that is separated from the first operation wiring layer, and that transmits a drain voltage from the operation driver.

The TFT layer may include a plurality of second via holes, wherein each second via hole from among the plurality of second via holes is electronically connected with a respective TFT from among the plurality of TFTs, and each second via hole from among the plurality of second via holes may be arranged at a position different from a position of a corresponding first via hole from among the plurality of first via holes on the substrate.

Each TFT from among the plurality of TFTs may include a gate, a drain, and a source, and the plurality of second via holes may include a plurality of second gate via holes, each second gate via hole from among the plurality of second gate via holes being electronically connected with the gate of a respective TFT from among the plurality of TFTs; and a plurality of second drain via holes, each second drain via hole from among the plurality of second drain via holes being electronically connected with the drain of a respective TFT from among the plurality of TFTs, and the plurality of first via holes may include a plurality of first gate via holes, each first gate via hole from among the plurality of first gate via holes being electronically connected with a respective second gate via hole from among the plurality of second gate via holes through a wiring layer; and a plurality of first drain via holes, each first drain via hole from among the plurality of first drain via holes being electronically connected with a respective second drain via hole from among the plurality of second drain via holes through the wiring layer.

The TFT layer may include a first conductive layer connecting at least one gate of a TFT from among the plurality of TFTs with a respective second gate via hole from among the plurality of second gate via holes; and a second conductive layer connecting at least one drain of a TFT from among the plurality of TFTs with a respective second drain via hole from among the plurality of second drain via holes.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 1B is a top surface view illustrating a display module according to an embodiment;

DETAILED DESCRIPTION

Figure 1A:
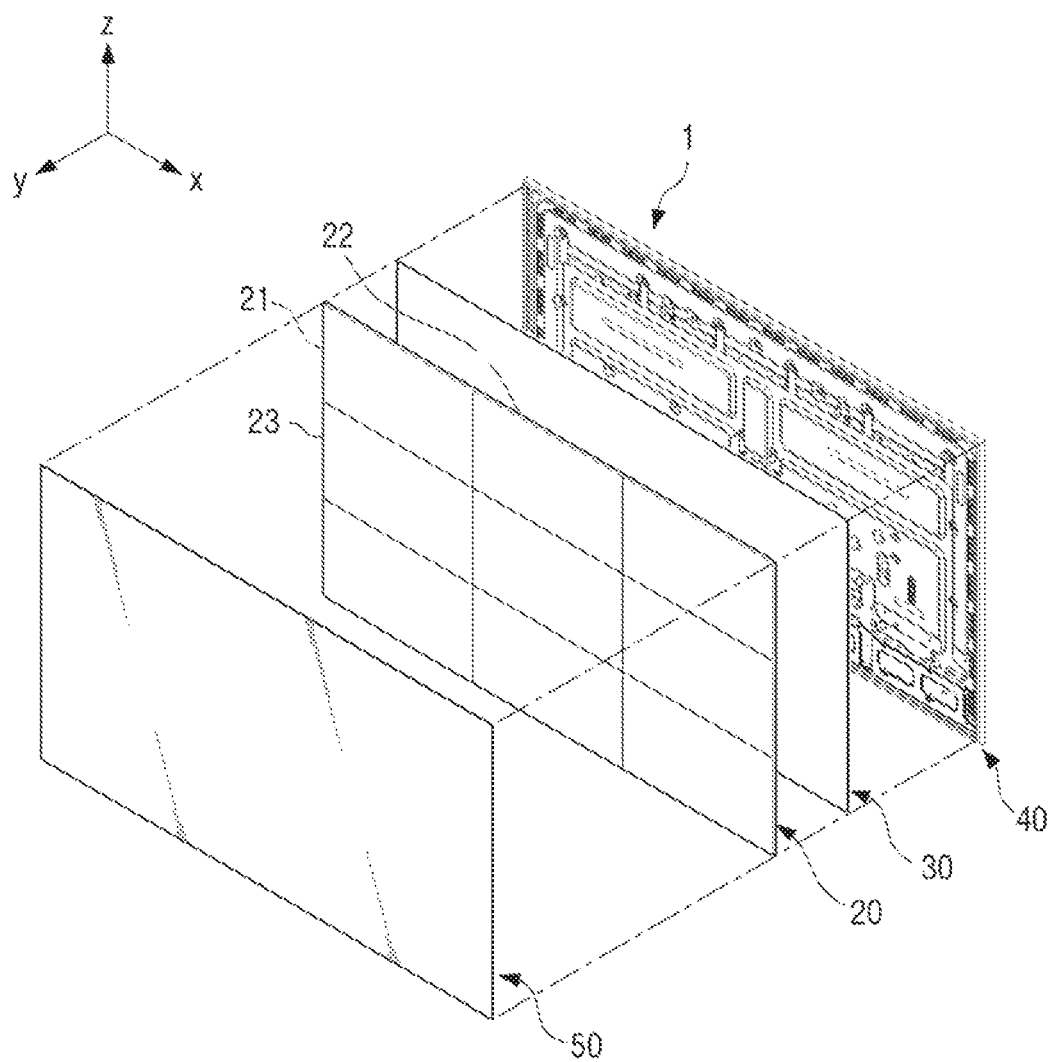
FIG. 1A is an exploded perspective view illustrating a display apparatus according to an embodiment.

Hereinafter, embodiments of the disclosure will be described with reference to the accompanying drawings, for comprehensive understanding of the constitution and the effect of the disclosure. However, it should be noted that the disclosure is not limited to the embodiments described herein, but may be implemented in various forms, and various modifications may be made to the embodiments of the disclosure. The descriptions of the embodiments of the disclosure are provided just to make the descriptions of the disclosure complete, and to make people having ordinary knowledge in the technical field to which the disclosure belongs fully understand the range of the disclosure. In the accompanying drawings, components were illustrated in more enlarged sizes than their actual sizes for the convenience of description, and the proportion of each component may be exaggerated or reduced.

In case it is described that a component is "on top of" or "contacts" another component, it should be understood that a component may directly contact or be connected with the top portion of another component, but still another component may exist between the components. In contrast, in case it is described that a component is "just on top of" or "directly contacts" another component, it may be understood that still another component does not exist between the components. Other expressions describing relations between components, for instance, expressions such as "between ~" and "directly between ~" may be interpreted in the same manner.

Terms such as "first," "second" and the like may be used to describe various elements, but the terms are not intended to limit the elements. Such terms are used only to distinguish one element from another element. For example, a first element may be called a second element, and a second element may be called a first element in a similar manner, without departing from the scope of protection of the disclosure.

Singular expressions include plural expressions, unless defined obviously differently in the context. Further, terms such as "include" and "have" should be construed as designating that there are such characteristics, numbers, steps, operations, elements, components or a combination thereof described in the specification, and the terms may be interpreted as denoting that one or more of other characteristics, numbers, steps, operations, elements, components or a combination thereof may be added.

Terms used in the embodiments of the disclosure may be interpreted as meanings generally known to those of ordinary skill in the art, unless defined differently in the disclosure.

The purpose of the disclosure may be in providing a display module with improved manufacturing efficiency and uniformness of operation signals.

In addition, a display module according to an example embodiment may be applied to a wearable device, a portable device, a handheld device, and an electronic product or an electronic device having various displays in a single unit, and may be applied to small display devices such as monitors for personal computers and TVs, and large display devices such as digital signage and electronic displays through a plurality of assembly arrangements.

Hereinafter, the configurations of the display apparatus 1 and the display module 21 according to an embodiment of the disclosure will be described with reference to FIGS. 1A to 3.

Figure 2:
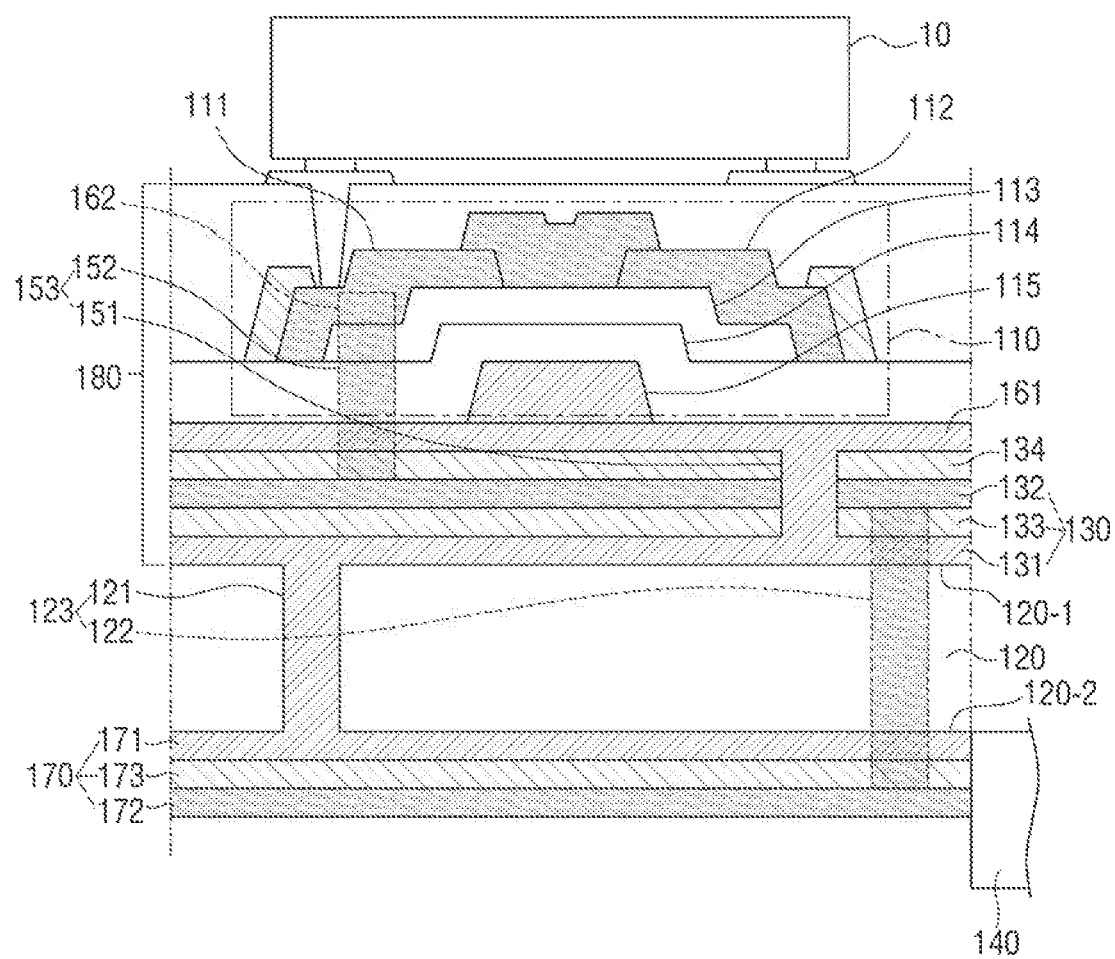
FIG. 2 is a schematic diagram of a cross section illustrated along the A-A line in FIG. 1.
Figure 3:
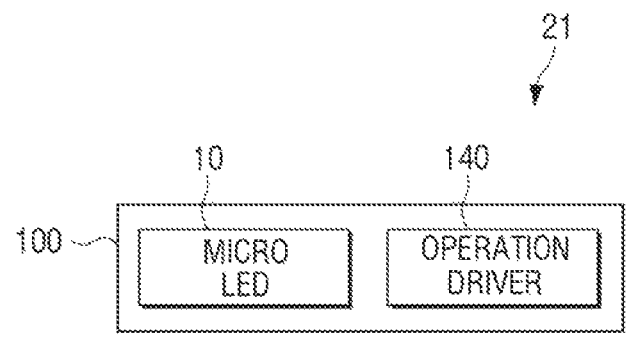
FIG. 3 is a block diagram illustrating micro LEDs and an operation driver.

FIG. 1A is an exploded perspective view illustrating a display apparatus 1 according to an embodiment of the disclosure, FIG. 1B is a top surface view illustrating a display module 21 according to an embodiment of the disclosure, FIG. 2 is a schematic diagram of a cross section illustrated along the A-A line in FIG. 1B, and FIG. 3 is a block diagram illustrating micro LEDs 10 and an operation driver 140.

The display apparatus 1 that will be described below is an apparatus that can process an image signal received from the outside, and can visually display a processed image, and may be implemented in various forms such as a television, a monitor, a portable multimedia apparatus, a portable communication apparatus, etc., and its form is not limited as long as it is an apparatus visually displaying an image.

As illustrated in FIG. 1A, the display apparatus 1 may include a protection member 50, a plurality of display modules 20, a support member 30, and a housing 40.

The protection member 50 may be arranged on the front surface (the Y axis direction in FIG. 1A) of the display apparatus 1, and may protect the plurality of display modules 20 arranged on the rear side of the protection member 50 from the outside.

The protection member 50 may consist of a thin glass material, and may consist of various materials depending on needs.

The plurality of display modules 20 may implement lights such that an image is displayed on the front side (the Y axis direction) according to an image signal input from the outside.

In addition, the plurality of display modules 20 may be arranged to suit the size of a display screen that each display module 20 manufactured as a module is to implement.

For example, in case the first and second display modules 21, 22 are arranged in parallel in the horizontal direction (the X axis direction), the display screen may be implemented such that the horizontal direction (the X axis direction) is longer than the vertical direction (the Z axis direction).

Also, in case the first and third display modules 21, 23 are arranged in parallel in the vertical direction (the Z axis direction), the display screen may be implemented such that the vertical direction (the Z axis direction) is longer than the horizontal direction (the X axis direction).

Accordingly, display screens in various sizes and forms may be implemented according to the number and form of the plurality of arranged display modules 20.

The support member 30 may be arranged on the rear surface of the plurality of display modules 20 and fix the plurality of display modules 20.

The support member 30 may be formed as a flat plate, and may be formed in various forms and sizes to suit the forms and sizes of the plurality of display modules 20.

Accordingly, the support member 30 may support the plurality of display modules 20 such that the plurality of display modules 20 are arranged in parallel on the same plane (e.g., the X-Z plane as shown in FIGS. 1A and 1B).

In addition, uniform luminance of a display screen may be implemented by implementing the same height among the display modules 20.

The housing 40 may form the exterior of the display apparatus 1, and may be arranged on the rear side of the support member 30, and stably fix the plurality of display modules 20 and the support member 30.

Also, the housing 40 may stably fix the edge area of the protection member 50.

Accordingly, the housing 40 may prevent various kinds of components included in the display apparatus 1 from being exposed to the outside, and may protect the various kinds of components included in the display apparatus 1 from external shock.

The display modules 20 are constituted in a plural number and all of them are constituted in the same configuration. Accordingly, for the convenience of explanation, the first display module 21 which is one of the plurality of display modules 20 will mainly be explained.

As shown in FIGS. 1B and 2, the display module 21 may include micro LEDs 10, a thin film transistor substrate 100 on which the micro LEDs 10 are arranged and which includes thin film transistors 110, and an operation driver 140 transmitting signals to the thin film transistors 110. The micro LEDs 10 are inorganic light emitting diodes, and their short edges (L) may be in sizes smaller than or equal to 100 μm. The micro LEDs 10 may include red micro LEDs radiating red lights, green micro LEDs radiating green lights, and blue micro LEDs radiating blue lights. In the micro LEDs 10, any one diode may radiate lights in a plurality of colors.

In addition, the micro LEDs 10 may form a display area of the display module 21. Here, the display area may mean an area wherein the display module 21 implements a display screen by the operation driver 140.

For example, the plurality of micro LEDs 10 may be arranged in the form of a grid on one surface of the display module 21.

The thin film transistor substrate 100 may fix the micro LEDs 10 arranged on the thin film transistor substrate 100 and may transmit operation signals that operate the micro LEDs 10.

The thin film transistor substrate 100 may include a transparent display substrate 120, a thin film transistor layer 180 arranged on the front surface of the transparent display substrate 120, and an operation wiring layer 170 arranged on the rear surface of the substrate 120.

Here, the front surface of the substrate 120 may be referred to as the first surface 120-1, and the rear surface of the substrate 120 may be referred to as the second surface 120-2.

The thin film transistor layer 180 may be laminated on the substrate 120, and may include the thin film transistors 110 and a plurality of second via holes 153 electronically connected with the thin film transistors 110. The plurality of second via holes 153 will be explained later.

The thin film transistor layer 180 may include a plurality of layers. The thin film transistors 110 may be arranged inside the thin film transistor layer 180 and may operate and control the micro LEDs 10 connected with the thin film transistors 110 by using transmitted operation signals.

Specifically, the thin film transistors 110 may include a gate 115, a gate insulating layer 114 arranged on the gate 115, a channel area 113 arranged in a position corresponding to the gate 115 on the gate insulating layer 114, and a drain 111 and a source 112 arranged on either side of the channel area 113.

The drain 111 and the source 112 may be selectively connected through the channel area 113, and may be formed of conductive materials such as metals, alloys, conductive metal oxides, or conductive metal nitrides. In addition, the drain 111 and the source 112 may be formed of a monolayer or multilayer structure.

The channel area 113 is a semiconductor into which a preset dopant has been infiltrated, and a channel conducting between the drain 111 and the source 112 may be formed according to an operation signal input into the gate 115. For example, the channel area 113 may be a crystalline semiconductor based on zinc. Here, a crystalline semiconductor may include zinc (Zn) and nitrogen (N), and may additionally include oxygen (O).

The channel area 113 may additionally include at least one other element in addition to zinc (Zn), oxygen (O), and nitrogen (N). For example, the channel area 113 may additionally include materials such as hafnium (Hf) and fluorine (F). Also, the channel area 113 may additionally include at least one element among a Group I element, a Group II element, a Group III element, a Group IV element, a Group V element, a Group VI element, a Group VII element, a transition metal element, and a lanthanide (Ln) series element.

The gate insulating layer 114 may be formed of materials including silicon oxide (SiO2) or a high-k material having a higher dielectric constant than that of silicon oxide. In addition, the gate insulating layer 114 may be formed of a monolayer or multilayer structure. For example, the gate insulating layer 114 may include silicon oxide (SiO2), silicon nitride (an Si3N4 layer), hafnium oxide (HfO2), aluminum oxide (Al2O3), etc.

The gate 115 may be formed of conductive materials such as metals, alloys, conductive metal oxides, or conductive metal nitrides. In addition, the gate 115 may be formed of a monolayer or multilayer structure. For example, the gate 115 may be formed of metals such as Au, Ag, Al, Pt, Ti, Ru, Mo, W, Cu, Nd, Cr, Ta, etc., or alloys including them.

In addition, the gate 115 may be formed of conductive oxides such as In—Sn—O (indium tinoxide: ITO), In—Zn—O (indium zinc oxide: IZO), Al—Zn—O (aluminum zinc oxide: AZO), Ga—Zn—O (gallium zinc oxide: GZO), and Zn—Sn—O (zinc tin oxide: ZTO), or compounds including them.

The plurality of second via holes 153 are passages directly transmitting signals to each of the thin film transistors 110, and may include a second gate via hole 151 connected with the gate 115 of the thin film transistor 110, and a second drain via hole 152 connected with the drain 111 of the thin film transistor 110.

Here, the second gate via hole 151 and the second drain via hole 152 are arranged in different positions on the same plane, and are not electronically connected. That is, the second gate via hole 151 and the second drain via hole 152 may be distributively arranged at a distance from each other inside the thin film transistor layer 180.

Also, the second gate via hole 151 and the second drain via hole 152 may be constituted in a plural number. In other words, more than one second gate via hole 151 and more than one second drain via hole 152 may be present.

In addition, the plurality of second via holes 153 may include conductive materials.

The thin film transistor layer 180 may include a plurality of thin film transistors 110 formed to correspond to the plurality of LEDs 10 on the front surface of the substrate 120.

In addition, the substrate 120 may be extensively arranged in a vertical direction and filled with conductive materials, and may include a plurality of first via holes 123 distributively arranged based on at least one of columns and/or rows of the plurality of LEDs. The plurality of first via holes 123 will be described later.

The substrate 120 may include materials having light permeability and heat resistance above a certain level. For example, the substrate 120 may be glass. Other than this, the substrate 120 may consist of any one or more of polycarbonate (PC), polyether-sulfone (PES), polyethylene-terephthalate (PET), polyethylene-naphthalate (PEN), and polyamide (PI).

A rectangular cross-sectional area of the substrate 120 may be greater than a specific size. Accordingly, on the substrate 120, a thin film transistor layer 180 may be formed. The cross section of the substrate 120 may not be limited to a rectangle, and it may be a square.

In addition, the substrate 120 may include a first surface 120-1 which is a front surface, and a second surface 120-2 which is a rear surface, and may include a plurality of first via holes 123 that are extensively arranged between the first surface 120-1 and the second surface 120-2, and are filled with conductive materials. That is, the substrate 120 may include a plurality of first via holes 123 extensively arranged in a vertical direction inside the substrate 120. In other words, the plurality of first via holes 123 may extend from the first surface 120-1 to the second surface 120-2.

The plurality of first via holes 123 may transmit an operation signal transmitted from an operation driver 140 arranged on the rear side of the substrate 120 to the thin film transistors 110. That is, the plurality of first via holes 123 may connect the thin film transistors 110 to the operation driver 140.

For example, the plurality of first via holes 123 may transmit an operation signal from the operation driver 140 to the plurality of second via holes 153.

Specifically, the plurality of first via holes 123 may include a first gate via hole 121 connected with the second gate via hole 151 through the wiring layer 130, and a first drain via hole 122 connected with the second drain via hole 152 through the wiring layer 130.

Here, the first gate via hole 121 and the first drain via hole 122 are arranged in different positions on the same plane, and are not electronically connected. That is, the first gate via hole 121 and the first drain via hole 122 may be arranged at a distance from each other inside the substrate 120.

Also, the first gate via hole 121 and the first drain via hole 122 may be constituted in a plural number. In other words, more than one first gate via hole 121 and more than one first drain via hole 122 may be present.

In addition, the plurality of first via holes 123 may not be arranged in a row with the plurality of second via holes 153. For example, based on a direction perpendicular to the front surface of the display module 21 (the Y axis direction as shown in FIGS. 1A and 1B), the positions of the plurality of first via holes 123 distributively arranged in the substrate 120 may be different from the positions of the plurality of second via holes 153 arranged in the thin film transistor layer 180.

Further, the thin film transistor layer 180 may include the wiring layer 130 that is arranged on the substrate 120 and electronically connects each of the plurality of first via holes 123 with corresponding second via holes of the plurality of second via holes 153.

Thin film transistors included in the thin film transistor layer 180 may not be limited to specific structures or types. Specifically, the thin film transistor may be formed by LTPS TFT, oxide TFT, Si TFT (polysilicon or a-silicon), organic TFT or graphene TFT, etc., and be applied by making only a P type (or N-type) MOSFET in the Si-wafer-CMOS process.

For example, the wiring layer 130 may include a third conductive layer 131 electronically connecting the second gate via hole 151 and the first gate via hole 121, a fourth conductive layer 132 electronically connecting the second drain via hole 152 and the first drain via hole 122, and an insulating layer 133 arranged between the third conductive layer 131 and the fourth conductive layer 132.

Accordingly, the wiring layer 130 may electronically connect the plurality of second via holes 153 and the plurality of first via holes 123 in a structure wherein each of the plurality of second via holes 153 is arranged in the thin film transistor layer 180 in a different position from each of the plurality of first via holes 123 in the plane of the substrate 120.

That is, the third conductive layer 131 may include a circuit that electronically connects the first gate via hole 121 and the second gate via hole 151. In addition, the fourth conductive layer 132 may include a circuit that electronically connects the first drain via hole 122 and the second drain via hole 152.

Further, the insulating layer 133 includes electronically insulating materials, and may insulate the third conductive layer 131 from the fourth conductive layer 132. Accordingly, interference can be prevented between a gate signal (or a gate voltage) moving through the path including the first gate via hole 121, the third conductive layer 131, and the second gate via hole 151 and a drain signal (or a drain voltage) moving through the path including the first drain via hole 122, the fourth conductive layer 132, and the second drain via hole 152.

Accordingly, the wiring layer 130 may electronically connect the plurality of first via holes 123 formed in the substrate 120 to the plurality of second via holes 153 arranged in different positions from the plurality of first via holes 123, and at the same time, electronically separate a gate voltage and a drain voltage.

Also, while FIG. 2 illustrates a structure wherein the third conductive layer 131, the insulating layer 133, and the fourth conductive layer 132 are sequentially laminated on the substrate 120, the components may be laminated in various orders if the third conductive layer 131 and the fourth conductive layer 132 are electronically separated.

In addition, in the top part of the wiring layer 130, an additional insulating layer 134 for electronically separating the wiring layer 130 and the thin film transistors 110 may be arranged.

The operation driver 140 may be arranged on the rear side of the substrate 120, and transmit an operation signal operating the thin film transistors 110. For example, the operation driver 140 may transmit a gate voltage and a drain voltage to the thin film transistors 110, and thereby control the micro LEDs 10.

Also, the operation driver 140 may convert digital video data into analog data voltages and transmit them to the thin film transistors 110 as gate voltages and drain voltages.

Although it was described that the operation driver 140 is one component and transmits gate voltages and drain voltages, depending on needs, the operation driver 140 may include a gate driver transmitting gate voltages, and a drain driver transmitting drain voltages.

In addition, the operation driver 140 may be fixedly arranged on the rear surface of the substrate 120. For example, in case the substrate 120 is a glass substrate, the operation driver 140 may be arranged as a chip on glass (COG) type.

However, the operation driver 140 is not limited thereto, and it may be connected with the substrate 120 by a chip on film (COF) or chip on plastic (COP), or chip on board (COB) method.

In addition, the thin film transistor substrate 100 may include an operation wiring layer 170 that is arranged on the second surface 120-2 of the substrate 120, and transmits a signal from the operation driver 140 to the plurality of first via holes 123.

Specifically, the operation wiring layer 170 may include a first operation wiring layer 171 transmitting a gate voltage from the operation driver 140 to the first gate via hole 121, a second operation wiring layer 172 transmitting a drain voltage from the operation driver 140 to the first drain via hole 122, and an operation wiring insulating layer 173 arranged between the first operation wiring layer 171 and the second operation wiring layer 172.

Accordingly, the operation wiring layer 170 may transmit a gate voltage and a drain voltage respectively to the first gate via hole 121 and the first drain via hole 122.

That is, the first operation wiring layer 171 may include a circuit that electronically connects the first gate via hole 121 and the operation driver 140. In addition, the second operation wiring layer 172 may include a circuit that electronically connects the first drain via hole 122 and the operation driver 140.

Further, the operation wiring insulating layer 173 includes electronically insulating materials, and may insulate between the first operation wiring layer 171 and the second operation wiring layer 172. Accordingly, interference between a gate voltage and a drain voltage from the operation driver 140 can be prevented.

Also, while FIG. 2 illustrates a structure wherein the first operation wiring layer 171, the operation wiring insulating layer 173, and the second operation wiring layer 172 are sequentially laminated, the components may be laminated in various orders if the first operation wiring layer 171 and the second operation wiring layer 172 are electronically separated.

Hereinafter, the configurations of the first conductive layer 161, the second conductive layer 162, and the plurality of second via holes 153 will be described in detail with reference to FIGS. 2 to 6.

Figure 4:
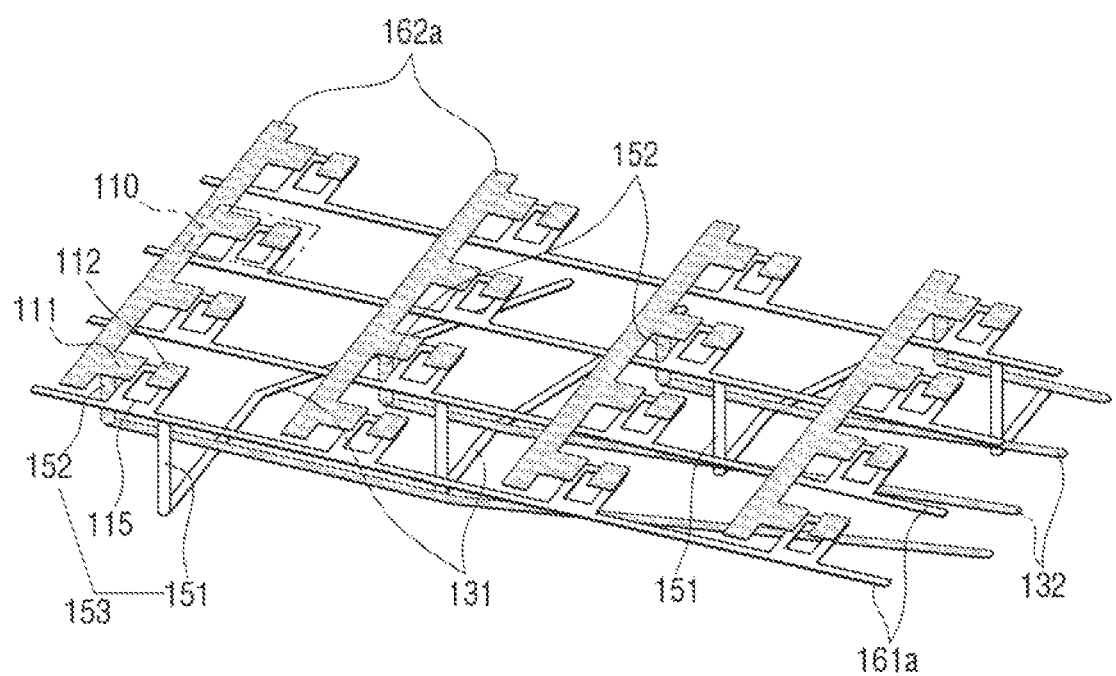
FIG. 4 is a schematic perspective view illustrating a first conductive layer and a second conductive layer according to an embodiment.
Figure 5A:
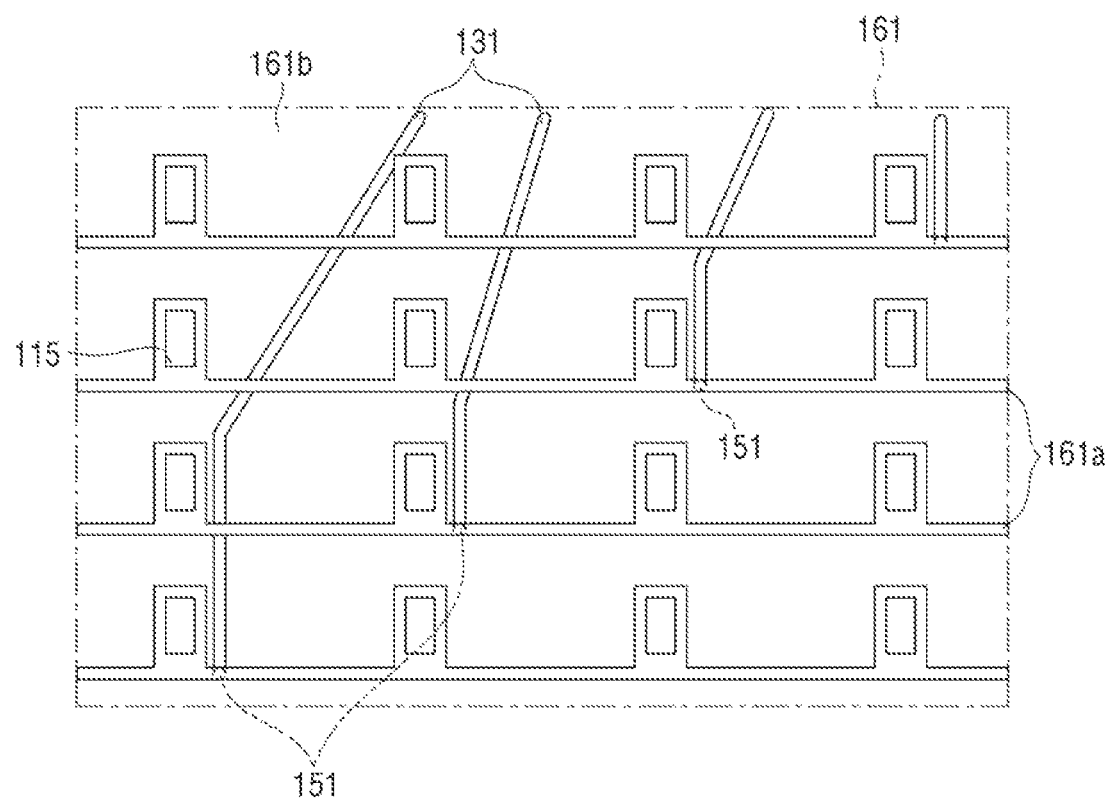
FIG. 5A is a top surface view illustrating a first conductive layer according to an embodiment.
Figure 5B:
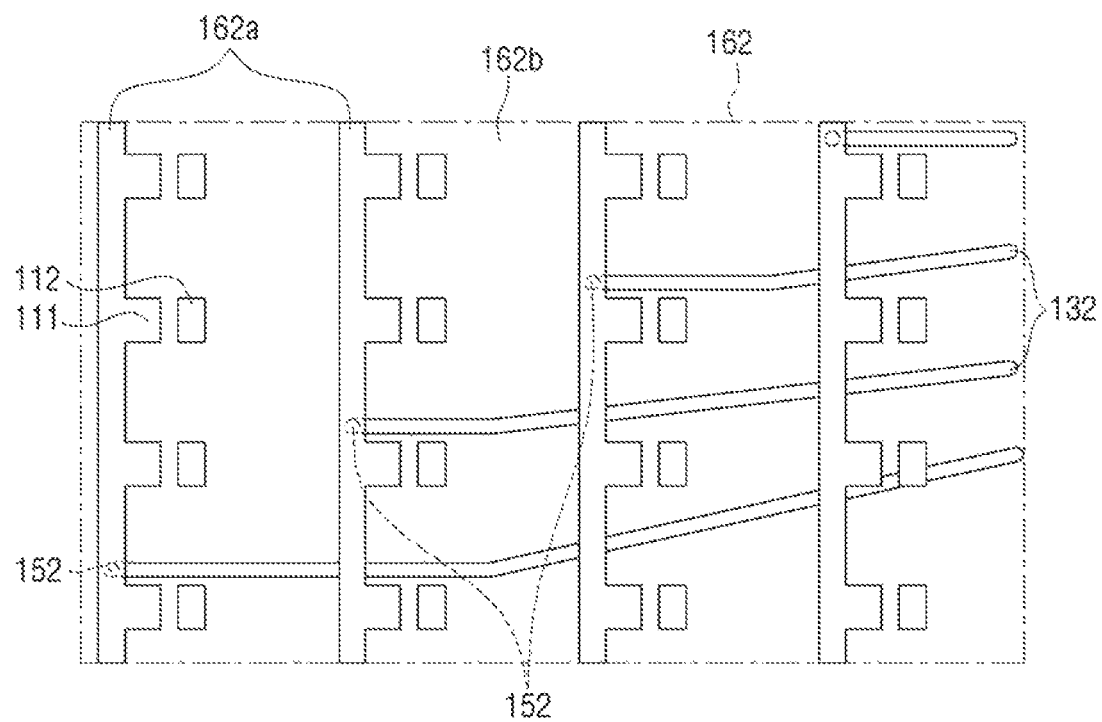
FIG. 5B is a top surface view illustrating a second conductive layer according to an embodiment.
Figure 6:
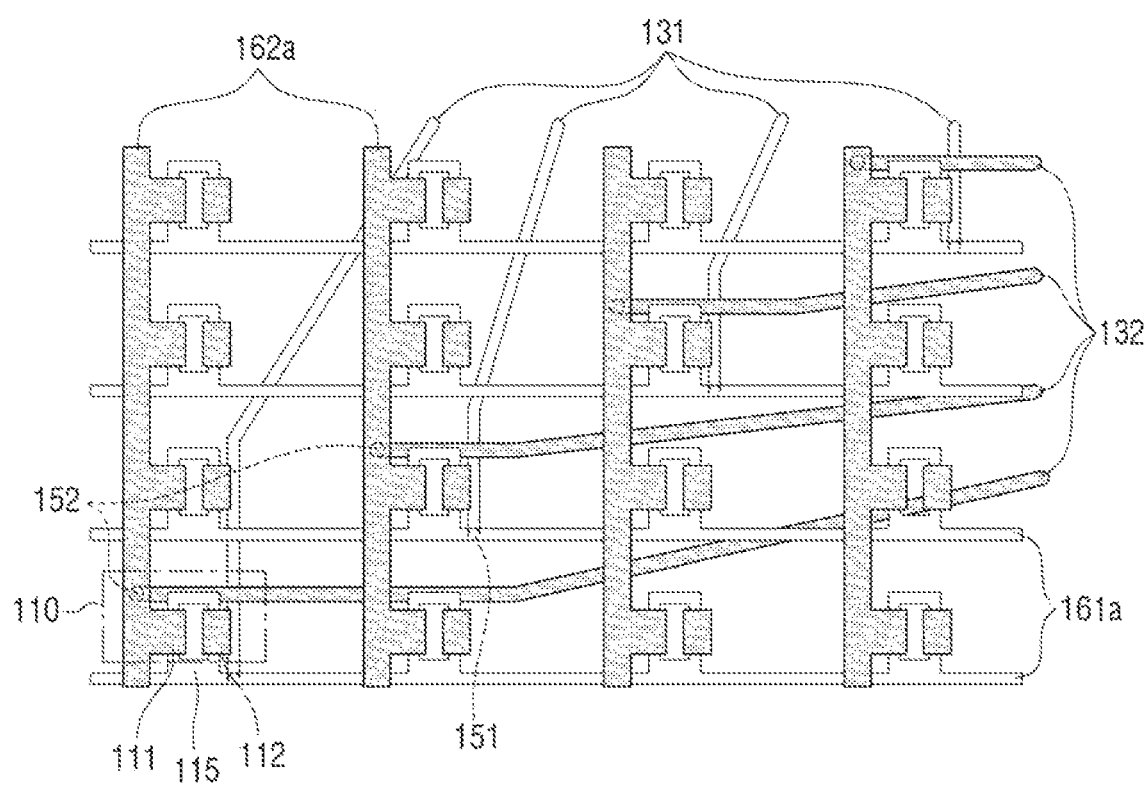
FIG. 6 is a schematic top surface view illustrating a first conductive layer and a second conductive layer according to an embodiment.

FIG. 4 is a schematic perspective view illustrating a first conductive layer 161 and a second conductive layer 162 according to an embodiment of the disclosure, FIG. 5A is a top surface view illustrating the first conductive layer 161 according to an embodiment of the disclosure, FIG. 5B is a top surface view illustrating the second conductive layer 162 according to an embodiment of the disclosure, and FIG. 6 is a schematic top surface view illustrating the first conductive layer 161 and the second conductive layer 162 according to an embodiment of the disclosure.

As illustrated in FIGS. 4 and 6, inside the thin film transistor layer 180, the plurality of thin film transistors 110 may be arranged in the form of a grid. The plurality of thin film transistors 110 are not limited to a grid form, but may be arranged in various ways depending on needs.

In addition, the thin film transistor layer 180 may include the first conductive layer 161 connecting at least one of the gates 115 of the plurality of thin film transistors 110 to a second gate via hole of the plurality of second gate via holes 151 and the second conductive layer 162 connecting at least one of the drains 111 of the plurality of thin film transistors 110 to a second drain via hole of the plurality of second drain via holes 152.

Specifically, considering that each of the thin film transistors 110 includes a drain 111, a source 112, and a gate 115, as the thin film transistors 110 are arranged in the form of a grid, the drain 111, the source 112, and the gate 115 may also be arranged in the form of a grid.

Referring to FIG. 5A, the first conductive layer 161 may include the gates 115 arranged in the form of a grid, and may include a plurality of conductive gate wirings 161*a* that are connected with the gates 115 of each of the plurality of thin film transistors 110 and are arranged in a row direction. In other words, the plurality of conductive gate wirings 161*a* may each extend in a first direction.

For example, the plurality of conductive gate wirings 161*a* may be formed to extend in a horizontal direction inside the first conductive layer 161, and each conductive gate wiring 161*a* may connect the plurality of gates 115 that are arranged on the same horizontal line.

In addition, the plurality of conductive gate wirings 161*a* may be arranged to be in parallel with one another at predetermined intervals. Accordingly, a conductive gate wiring in a row and a conductive gate wiring in another row may be electronically separated.

Also, to one conductive gate wiring 161*a*, one second gate via hole 151 may be connected. Accordingly, a gate voltage transmitted through the one second gate via hole 151 may be transmitted only to the conductive gate wiring 161*a* connected to the one second gate via hole 151. Accordingly, a gate voltage transmitted through the one second gate via hole 151 may be transmitted to all of the plurality of gates 115 arranged on the same row.

In addition, the number of the plurality of second gate via holes 151 and the number of the plurality of conductive gate wirings 161*a* may be the same.

Further, the first conductive layer 161 may include a gate insulating area 161*b* formed in an area other than the area wherein the plurality of conductive gate wirings 161*a* are formed. The gate insulating area 161*b* may insulate the plurality of conductive gate wirings 161*a* from each other, and thereby prevent mixing and interference of gate voltages transmitted to each of the plurality of conductive gate wirings 161*a*.

Also, the plurality of second gate via holes 151 may be arranged in different positions with respect to a row direction. For example, as illustrated in FIG. 5A and FIG. 6, the plurality of second gate via holes 151 may not be arranged in parallel on the same column. That is, each of the plurality of second gate via holes 151 may be arranged in a different column.

In addition, the plurality of second gate via holes 151 may be distributively arranged such that each row and/or column of a grid of the plurality of LEDs 10 includes a second gate via hole 151 as shown, e.g., in FIG. 5A.

Accordingly, gate voltages are transmitted to the plurality of gates 115 through the second gate via hole 151, and considering that the strength of a signal becomes weaker as it becomes farther from the second gate via hole 151, as the plurality of second gate via holes 151 are distributively arranged, uniformness of the strength of gate voltages can be improved.

In addition, referring to FIG. 2, one end of the first gate via hole 121 may be connected with the third conductive layer 131, and the other end of the first gate via hole 121 may be connected with the first operation wiring layer 171. Also, one end of the second gate via hole 151 may be connected with the first conductive layer 161, and the other end of the second gate via hole 151 may be connected with the third conductive layer 131.

Also, referring to FIG. 5B, the second conductive layer 162 may include a drain 111 and a source 112 arranged in the form of a grid, and may include a plurality of conductive drain wirings 162a that are connected with each drain 111 of the plurality of thin film transistors 110 and are arranged in a column direction. In other words, the plurality of conductive drain wirings 162a may each extend in a second direction perpendicular to the first direction in which the plurality of conductive gate wirings 161a extend.

For example, the plurality of conductive drain wirings 162a may be formed to extend in a vertical direction inside the second conductive layer 162, and each conductive drain wiring 162a may connect the plurality of drains 111 that are arranged on the same vertical line.

In addition, the plurality of conductive drain wirings 162a may be arranged in parallel with one another at predetermined intervals. Accordingly, a conductive drain wiring in one column and a conductive drain wiring in another column may be electronically separated.

Also, to one conductive drain wiring 162a, one second drain via hole 152 may be connected. Accordingly, a drain voltage transmitted through the one second drain via hole 152 may be transmitted only to the conductive drain wiring 162a connected to the one second drain via hole 152. Accordingly, a drain voltage transmitted through the one second drain via hole 152 may be transmitted to all of the plurality of drains 111 arranged on the same column.

In addition, the number of the plurality of second drain via holes 152 and the number of the plurality of conductive drain wirings 162a may be the same.

Further, the second conductive layer 162 may include a drain insulating area 162b formed in an area other than the area wherein the plurality of conductive drain wirings 162a are formed. The drain insulating area 162b may insulate the plurality of conductive drain wirings 162a from each other, and thereby prevent mixing and interference of drain voltages transmitted to each of the plurality of conductive drain wirings 162a.

In addition, the plurality of second drain via holes 152 may be arranged in different positions with respect to a column direction. For example, as illustrated in FIG. 5B and FIG. 6, the plurality of second drain via holes 152 may not be arranged in parallel on the same row. That is, each of the plurality of second drain via holes 152 may be arranged in a different row.

Also, the plurality of second drain via holes 152 may be distributively arranged such that each row and/or column of a grid of the plurality of LEDs 10 includes a second drain via hole 152 as shown, e.g., in FIG. 5B. Accordingly, drain voltages are transmitted to the plurality of drains 111 through the second drain via hole 152, and considering that the strength of a signal becomes weaker as it becomes farther from the second drain via hole 152, as the plurality of second drain via holes 152 are distributively arranged, uniformness of the strength of drain voltages can be improved.

In addition, referring to FIG. 2, one end of the first drain via hole 122 may be connected with the fourth conductive layer 132, and the other end of the first drain via hole 122 may be connected with the second operation wiring layer 172. Also, one end of the second drain via hole 152 may be connected with the second conductive layer 162, and the other end of the second gate via hole 151 may be connected with the fourth conductive layer 132.

As illustrated in FIG. 6, each thin film transistor 110 is electronically connected with one conductive gate wiring 161a and one conductive drain wiring 162a.

In addition, each conductive gate wiring 161a may be electronically connected with one second gate via hole 151, and each conductive drain wiring 162a may be electronically connected with one second drain via hole 152.

More specifically, referring to FIG. 2 and FIG. 6, one gate voltage from the operation driver 140 is transmitted along a path including the first operation wiring layer 171, the first gate via hole 121, the third conductive layer 131, the second gate via hole 151, and the conductive gate wiring 161a. Afterwards, the gate voltage transmitted to the conductive gate wiring 161a may be transmitted to the plurality of gates 115 connected with the one conductive gate wiring 161a.

Here, the plurality of second gate via holes 151 are not arranged on the same row, but are distributively arranged. Accordingly, gate voltages are not transmitted at once from the left side to the right side, or from the right side to the left side, but they may be transmitted while being distributed according to the positions of the plurality of second gate via holes 151 that are distributively arranged.

Accordingly, in one display module unit, overall gate voltages are distributed and uniformness above a certain level can be maintained. That is, considering that the luminance and color of the micro LEDs 10 are determined by gate voltages, uniformness of the overall luminance and color of the plurality of micro LEDs 10 on the display module 21 can be improved.

Also, the second gate via holes 151 may be arranged in different positions from the first gate via holes 121.

Here, considering that the first gate via holes 121 are formed by puncturing holes on the substrate 120 having hardness above a certain level and filling the holes with conductive materials, in the formation process of the first gate via holes 121 that are distributively arranged, damage such as cracks of the substrate 120 may occur.

Accordingly, as the second gate via holes 151 may be formed in the process of forming the thin film transistor layer 180 to be laminated on the substrate 120, manufacturing efficiency of the second gate via holes 151 distributively arranged can be improved.

Referring to FIG. 2 and FIG. 6, one drain voltage from the operation driver 140 is transmitted along a path including the second operation wiring layer 172, the first drain via hole 122, the fourth conductive layer 132, the second drain via hole 152, and the conductive drain wiring 162a. Afterwards, the drain voltage transmitted to the conductive drain wiring 162a may be transmitted to the plurality of drains 111 connected with the one conductive drain wiring 162a.

Here, the plurality of second drain via holes 152 are not arranged on the same column, but are distributively arranged. Accordingly, drain voltages are not transmitted at once from the upper side to the lower side, or from the lower side to the upper side, but they may be transmitted while being distributed according to the positions of the plurality of second drain via holes 152 that are distributively arranged.

Accordingly, in one display module unit, overall drain voltages are distributed and uniformness above a certain level can be maintained. That is, considering that the luminance and color of the micro LEDs 10 are determined by drain voltages, uniformness of the overall luminance and color of the plurality of micro LEDs 10 on the display module 21 can be improved.

Also, the second drain via holes 152 may be arranged in different positions from the first drain via holes 122.

Here, considering that the first drain via holes 122 are formed by puncturing holes on the substrate 120 having hardness above a certain level and filling the holes with conductive materials, in the formation process of the first drain via holes 122 that are distributively arranged, damage such as cracks of the substrate 120 may occur.

Accordingly, as the second drain via holes 152 may be formed in the process of forming the thin film transistor layer 180 to be laminated on the substrate 120, manufacturing efficiency of the second drain via holes 152 distributively arranged can be improved.

Hereinafter, the detailed configurations of the plurality of first via holes 123 and the plurality of second via holes 153 according to an embodiment of the disclosure will be described with reference to FIGS. 7A to 7C.

Figure 7A:
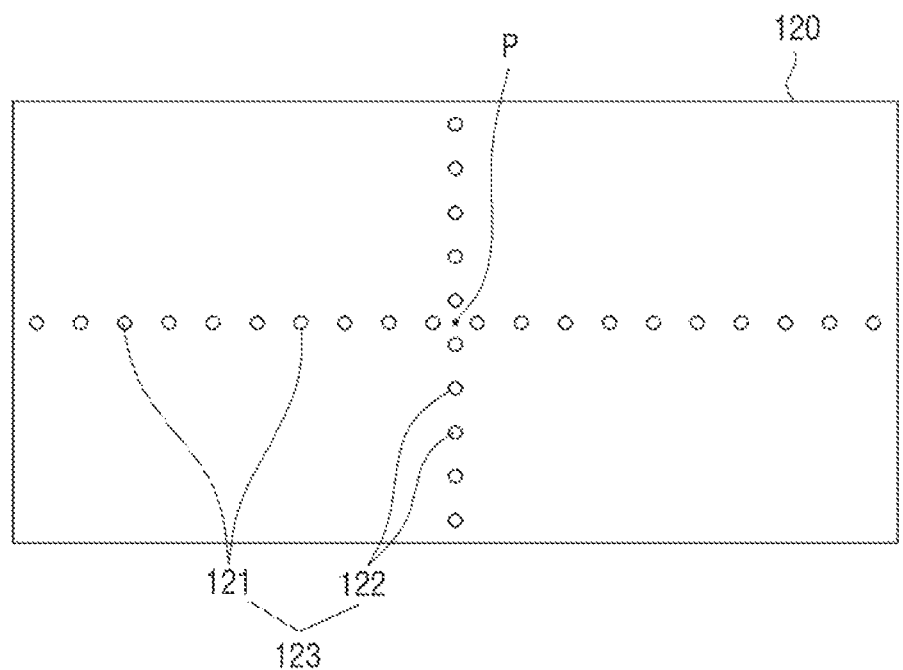
FIG. 7A is a top surface view illustrating a plurality of first via holes of a transparent glass substrate according to an embodiment.
Figure 7B:
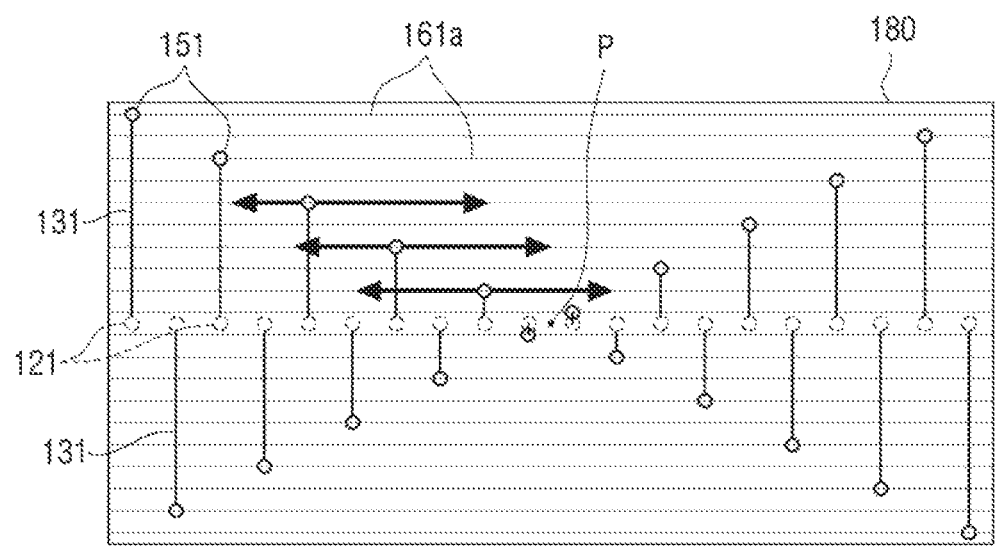
FIG. 7B is a top surface view illustrating second gate via holes on a thin film transistor layer in the configuration in FIG. 7A.
Figure 7C:
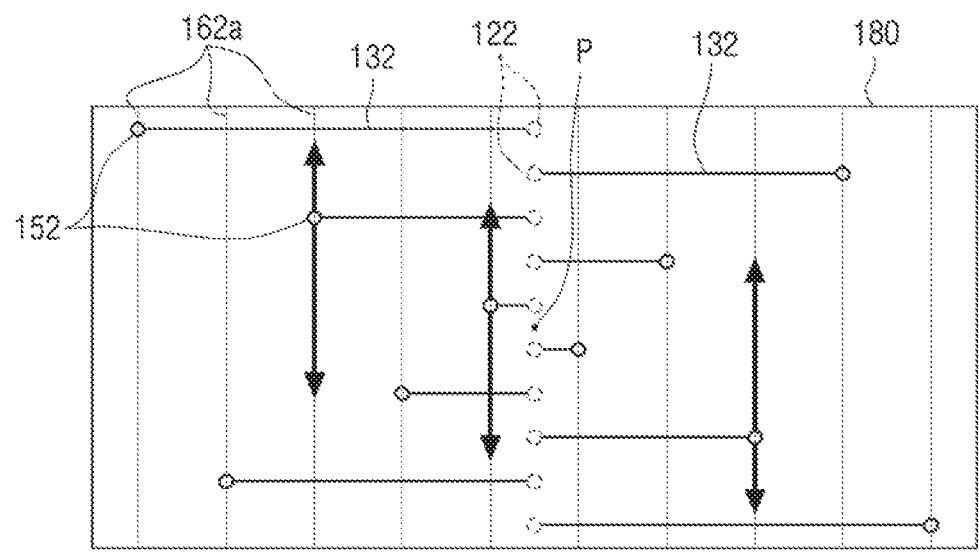
FIG. 7C is a top surface view illustrating second drain via holes on a thin film transistor layer in the configuration in FIG. 7A.

FIG. 7A is a top surface view illustrating a plurality of first via holes 123 of a transparent glass substrate 120 according to an embodiment of the disclosure, FIG. 7B is a top surface view illustrating second gate via holes 151 formed in a thin film transistor layer 180 in the configuration in FIG. 7A, and FIG. 7C is a top surface view illustrating second drain via holes 152 formed in a thin film transistor layer 180 in the configuration in FIG. 7A.

Referring to FIG. 7A, the plurality of first gate via holes 121 may be arranged in a row in the substrate 120, and the plurality of first drain via holes 122 may be arranged in a column in the substrate 120.

For example, an extended line of the row of the plurality of first gate via holes 121 and an extended line of the column of the plurality of first drain via holes 122 may be arranged to pass through the center P of the substrate 120.

Here, the number of the plurality of first gate via holes 121 may be the same as the number of the plurality of conductive gate wirings 161*a*. In addition, the number of the plurality of first drain via holes 122 may be the same as the number of the plurality of conductive drain wirings 162*a*.

Next, as illustrated in FIG. 7B, the plurality of second gate via holes 151 may be alternatingly arranged with the row of the plurality of first gate via holes 121 as the center. In other words, the plurality of second gate via holes 151 may be arranged alternatingly on opposite sides of the row of the plurality of first gate via holes 121. In addition, the plurality of second gate via holes 151 may be arranged to become closer to the plurality of first gate via holes 121 as they become more adjacent to the center P of the substrate 120. In other words, a distance from each second gate via hole 151 to the row of the plurality of first gate via holes 121 is proportional to a distance of the second gate via hole 151 to the center P of the substrate 120.

For example, one second gate via hole 151 is connected with one first gate via hole 121 arranged on the same column through the third conductive layer 131. In addition, one second gate via hole 151 may be connected with one conductive gate wiring 161*a*.

That is, on the plurality of conductive gate wirings 161*a*, the plurality of second gate via holes 151 may be distributively arranged.

Accordingly, signals of gate voltages may be transmitted in left and right directions with respect to one conductive gate wiring 161*a*. Here, the second gate via hole 151 is an initial signal terminal, and may transmit gate voltages to the gates 115 of the plurality of thin film transistors 110.

Accordingly, considering that the strength of a signal becomes weaker as it becomes farther from the second gate via hole 151, or time differences of responses for gate voltages occur, through the structure wherein the plurality of second gate via holes 151 are distributively arranged, differences of response signals of gate voltages for the display module 21 may become uniform.

Accordingly, uniform luminance of the plurality of micro LEDs 10 of the display module 21 can be implemented.

In addition, as illustrated in FIG. 7C, the plurality of second drain via holes 152 may be alternatingly arranged with the column of the plurality of first drain via holes 122 as the center. In other words, the plurality of second drain via holes 152 may be arranged alternatingly on opposite sides of the column of the plurality of first drain via holes 122. Also, the plurality of second drain via holes 152 may be arranged to become closer to the plurality of first drain via holes 122 as they become more adjacent to the center P of the substrate 120. In other words, a distance from each second drain via hole 152 to the column of the plurality of first drain via holes 122 is proportional to a distance of the second drain via hole 152 to the center P of the substrate 120.

For example, one second drain via hole 152 may be connected with one first drain via hole 122 arranged on the same row through the fourth conductive layer 132. In addition, one second drain via hole 152 may be connected with one conductive drain wiring 162*a*.

That is, on the plurality of conductive drain wirings 162*a*, the plurality of second drain via holes 152 may be distributively arranged.

Accordingly, signals of drain voltages may be transmitted in up and down directions with respect to one conductive drain wiring 162*a*. Here, the second drain via hole 152 is an initial signal terminal, and may transmit drain voltages to the drains 111 of the plurality of thin film transistors 110.

Accordingly, considering that the strength of a signal becomes weaker as it becomes farther from the second drain via hole 152, or time differences of responses for drain voltages occur, through the structure wherein the plurality of second drain via holes 152 are distributively arranged, differences of response signals of drain voltages for the display module 21 may become uniform.

Accordingly, uniform luminance of the plurality of micro LEDs 10 of the display module 21 can be implemented.

Hereinafter, the detailed configurations of a plurality of first via holes 123' and a plurality of second via holes 153' according to an embodiment of the disclosure will be described with reference to FIGS. 8A to 8C.

Figure 8A:
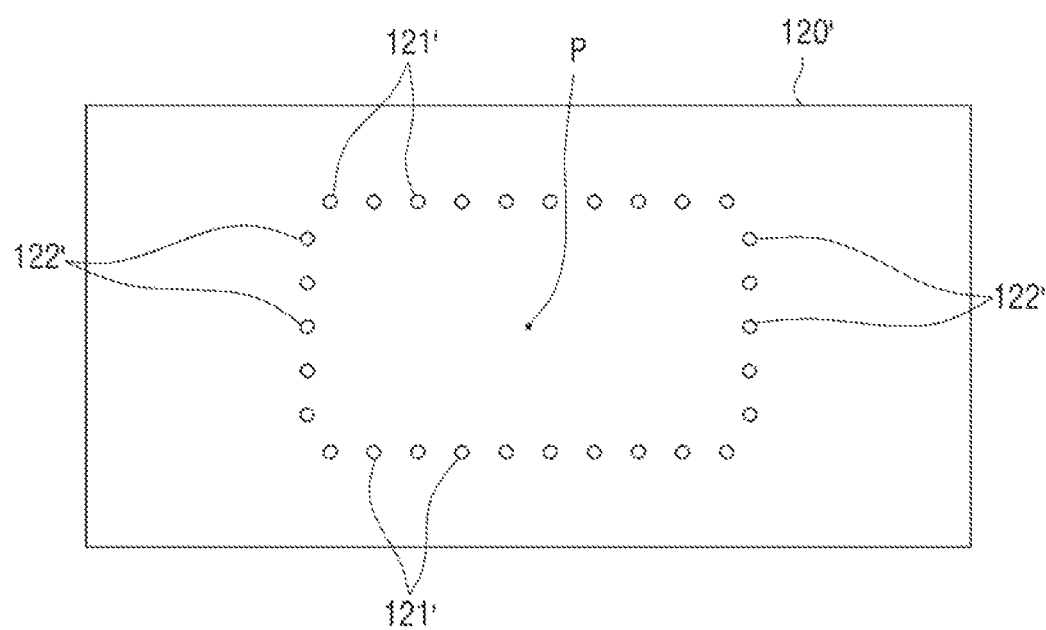
FIG. 8A is a top surface view illustrating a plurality of first via holes according to another embodiment.

As illustrated in FIG. 8A, a plurality of first drain via holes 121' may be arranged in a plurality of rows on a transparent glass substrate 120', and a plurality of first gate via holes 122' may be arranged in a plurality of columns on the transparent display substrate 120'.

Figure 8B:
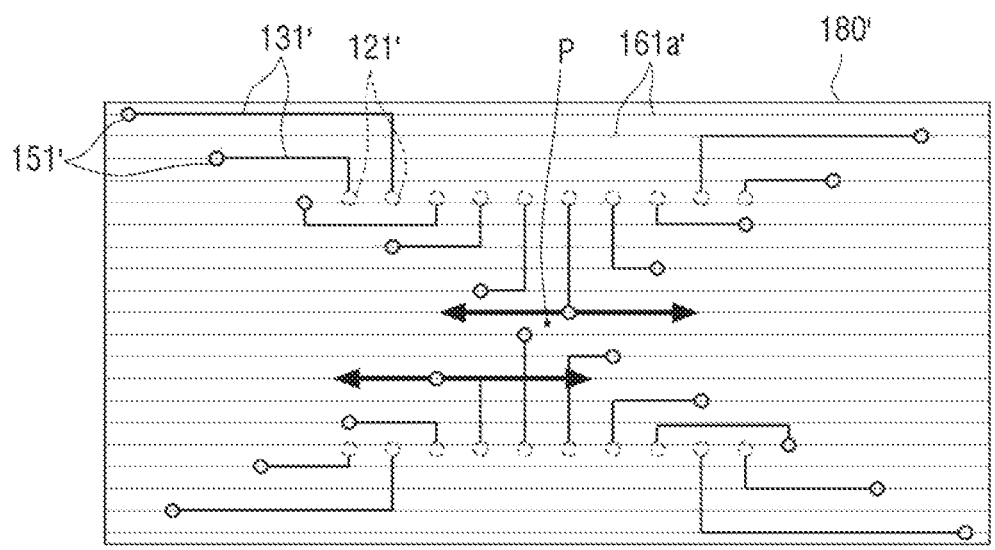
FIG. 8B is a top surface view illustrating second gate via holes on a thin film transistor layer in the configuration in FIG. 8A.

Next, as illustrated in FIG. 8B, the plurality of second gate via holes 151' may be symmetrically arranged with respect to the center P of the transparent display substrate 120'.

For example, the plurality of second gate via holes 151' illustrated in FIG. 8B may be arranged in the same positions as those of the plurality of second gate via holes 151 illustrated in FIG. 7B. The plurality of first gate via holes 121' illustrated in FIG. 8A may be arranged in different positions from those of the plurality of first gate via holes 121 illustrated in FIG. 7A.

Accordingly, compared to the plurality of first gate via holes 121', the plurality of second gate via holes 151' may be distributively arranged freely.

Figure 8C:
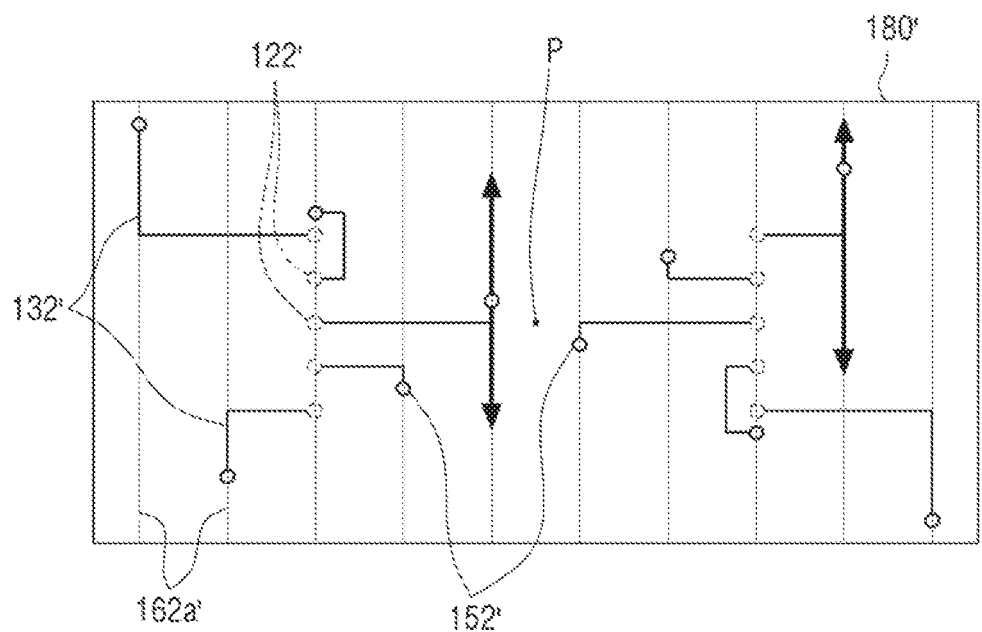
FIG. 8C is a top surface view illustrating second drain via holes on a thin film transistor layer in the configuration in FIG. 8B.

As illustrated in FIG. 8C, the plurality of second drain via holes 152' may be symmetrically arranged with respect to the center P of the transparent display substrate 120'.

For example, the plurality of second drain via holes 152' illustrated in FIG. 8C may be arranged in the same positions as the plurality of second drain via holes 152 illustrated in FIG. 7C. The plurality of first drain via holes 122' illustrated in FIG. 8A may be arranged in different positions from the plurality of first drain via holes 122 illustrated in FIG. 7A.

Accordingly, compared to the plurality of first drain via holes 122', the plurality of second drain via holes 152' may be distributively arranged freely.

That is, considering that, as illustrated in FIGS. 8A to 8C, while the plurality of second via holes are formed in the process wherein the thin film transistor layer is formed, the plurality of first via holes are newly formed on a transparent display substrate in a hardened state, formation of the plurality of second via holes distributively arranged may be easy.

Accordingly, signals from the operation driver 140 can be distributed, and at the same time, the manufacturing cost and manufacturing yield of formation of the plurality of second via holes can be greatly improved, and thus manufacturing efficiency can be improved.

In the above, the various embodiments of the disclosure have been described separately from one another, but each embodiment does not necessarily have to be implemented independently, and the configuration and operation of each embodiment may be implemented in combination with at least one other embodiment.

Also, while embodiments of the disclosure have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A display module comprising:
    a substrate comprising a thin film transistor (TFT) layer comprising a plurality of TFTs;
    a plurality of light emitting diodes (LEDs) arranged on a front surface of the substrate, each LED from among the plurality of LEDs corresponding to a respective TFT from among the plurality of TFTs; and
    an operation driver that is connected to the substrate and is configured to control an operation of the plurality of TFTs,
    wherein the substrate further comprises a transparent display substrate including a plurality of first via holes extending in a vertical direction from a front surface of the transparent display substrate to a rear surface of the transparent display substrate,
    wherein the plurality of first via holes are filled with conductive materials,
    wherein the plurality of first via holes connect the plurality of TFTs to the operation driver,
    wherein the TFT layer further comprises a wiring layer that electronically connects each first via hole from among the plurality of first via holes to a respective second via hole from among the plurality of second via holes,
    wherein each TFT from among the plurality of TFTs comprises a gate, a drain, and a source,
    wherein the plurality of second via holes comprises:
        a plurality of second gate via holes, each second gate via hole from among the plurality of second gate via holes being electronically connected to the gate of at least one respective TFT from among the plurality of TFTs; and
        a plurality of second drain via holes, each second drain via hole from among the plurality of second drain via holes being electronically connected to the drain of at least one respective TFT from among the plurality of TFTs,
    wherein the plurality of first via holes comprises:
        a plurality of first gate via holes, each first gate via hole from among the plurality of first gate via holes being electronically connected to a respective second gate via hole from among the plurality of second gate via holes through the wiring layer; and
        a plurality of first drain via holes, each first drain via hole from among the plurality of first drain via holes being electronically connected to a respective second drain via hole from among the plurality of second drain via holes through the wiring layer,
    wherein the plurality of first gate via holes are arranged in one row on the substrate,
    wherein the plurality of second gate via holes are arranged alternatingly on opposite sides of the one row of the plurality of first gate via holes, and
    wherein the plurality of second gate via holes are arranged such that a distance from each second gate via hole from among the plurality of second gate via holes to the one row of the plurality of first gate via holes is proportional to a distance of the second gate via hole to a center of the substrate.

2. The display module of claim 1, further comprising an operation wiring layer that is provided on the rear surface of the transparent display substrate and is configured to control the operation of the plurality of TFTs through the plurality of first via holes,
    wherein the operation wiring layer comprises:
        a first operation wiring layer that is configured to transmit a gate voltage from the operation driver; and
        a second operation wiring layer that is separated from the first operation wiring layer, and is configured to transmit a drain voltage from the operation driver.

3. The display module of claim 1, wherein the TFT layer further comprises the plurality of second via holes,
    wherein each second via hole from among the plurality of second via holes is electronically connected to at least one respective TFT from among the plurality of TFTs, and
    wherein each second via hole from among the plurality of second via holes is provided at a position different from a position of a corresponding first via hole from among the plurality of first via holes on the transparent display substrate.

4. The display module of claim 1, wherein the plurality of TFTs are arranged in a grid, and
    wherein the TFT layer comprises:
        a first conductive layer connecting at least one gate of a TFT from among the plurality of TFTs to a respective second gate via hole from among the plurality of second gate via holes; and a second conductive layer connecting at least one drain of a TFT from among the plurality of TFTs to a respective second drain via hole from among the plurality of second drain via holes.

5. The display module of claim 4, wherein the first conductive layer comprises a plurality of conductive gate wirings, each conductive gate wiring from among the plurality of conductive gate wirings being connected to the gate of at least one respective TFT from among the plurality of TFTs, the plurality of conductive gate wirings extending in a first direction, and wherein the second conductive layer comprises a plurality of conductive drain wirings, each conductive drain wiring from among the plurality of conductive drain wirings being connected to the drain of at least one respective TFT from among the plurality of TFTs, the plurality of conductive drain wirings extending in a second direction perpendicular to the first direction.

6. The display module of claim 1, wherein the wiring layer comprises:

a third conductive layer electronically connecting the plurality of second gate via holes to the plurality of first gate via holes;

a fourth conductive layer electronically connecting the plurality of second drain via holes to the plurality of first drain via holes; and an insulating layer arranged between the third conductive layer and the fourth conductive layer.

7. The display module of claim 1, wherein the plurality of TFTs are arranged in a grid, and wherein each second drain via hole from among the plurality of second drain via holes is provided in a different row of the grid from each other second drain via hole from among the plurality of second drain via holes.

8. The display module of claim 1, wherein the plurality of TFTs are arranged in a grid, and wherein each second gate via hole from among the plurality of second gate via holes is provided in a different column of the grid from each other second gate via hole from among the plurality of second gate via holes.

9. The display module of claim 1, wherein the plurality of second gate via holes are symmetrically arranged with respect to the center of the substrate, and wherein the plurality of second drain via holes are symmetrically arranged with respect to the center of the substrate.

10. The display module of claim 1, wherein the plurality of first drain via holes are arranged in one column on the transparent display substrate, and wherein the plurality of second drain via holes are arranged alternatingly on opposite sides of the one column of the plurality of first drain via holes.

11. The display module of claim 10, wherein the plurality of second drain via holes are arranged such that a distance from each second drain via hole from among the plurality of second drain via holes to the one column of the plurality of first drain via holes is proportional to a distance of the second drain via hole to the center of the substrate.

12. A display apparatus comprising:
a plurality of display modules;
a support member supporting the plurality of display modules on a rear surface of the plurality of display modules; and a housing that fixes the plurality of display modules and the support member, wherein each display module from among the plurality of display modules comprises:

a substrate comprising a thin film transistor (TFT) layer comprising a plurality of TFTs;

a plurality of light emitting diodes (LEDs) forming a display area on a front surface of the substrate, each LED from among the plurality of LEDs corresponding to a respective TFT from among the plurality of TFTs; and an operation driver that is connected to the substrate and is configured to control an operation of the plurality of TFTs, and wherein the substrate further comprises a transparent display substrate including a plurality of first via holes extending in a vertical direction from a front surface of the transparent display substrate to a rear surface of the transparent display substrate, wherein the plurality of first via holes are filled with conductive materials and the plurality of first via holes connecting the plurality of TFTs to the operation driver, wherein the TFT layer further comprises a wiring layer that electronically connects each first via hole from among the plurality of first via holes to a respective second via hole from among the plurality of second via holes, wherein each TFT from among the plurality of TFTs comprises a gate, a drain, and a source, wherein the plurality of second via holes comprises:
a plurality of second gate via holes, each second gate via hole from among the plurality of second gate via holes being electronically connected to the gate of at least one respective TFT from among the plurality of TFTs; and a plurality of second drain via holes, each second drain via hole from among the plurality of second drain via holes being electronically connected to the drain of at least one respective TFT from among the plurality of TFTs, wherein the plurality of first via holes comprises:
a plurality of first gate via holes, each first gate via hole from among the plurality of first gate via holes being electronically connected to a respective second gate via hole from among the plurality of second gate via holes through the wiring layer, and a plurality of first drain via holes, each first drain via hole from among the plurality of first drain via holes being electronically connected to a respective second drain via hole from among the plurality of second drain via holes through the wiring layer, wherein the plurality of first gate via holes are arranged in one row on the substrate, and wherein the plurality of second gate via holes are arranged alternatingly on opposite sides of the one row of the plurality of first gate via holes, and wherein the plurality of second gate via holes are arranged such that a distance from each second gate via hole from among the plurality of second gate via holes to the one row of the plurality of first gate via holes is proportional to a distance of the second gate via hole to a center of the substrate.

13. The display apparatus of claim 12, further comprising an operation wiring layer that is provided on the rear surface of the transparent display substrate and is configured to control the operation of the plurality of TFTs through the plurality of first via holes, wherein the operation wiring layer comprises:

a first operation wiring layer that is configured to transmit a gate voltage from the operation driver; and a second operation wiring layer that is separated from the first operation wiring layer, and is configured to transmit a drain voltage from the operation driver.

14. The display apparatus of claim 12, wherein the TFT layer includes a plurality of second via holes, wherein each second via hole from among the plurality of second via holes is electronically connected to a respective TFT from among the plurality of TFTs, and wherein each second via hole from among the plurality of second via holes is provided at a position different from a position of a corresponding first via hole from among the plurality of first via holes on the transparent display substrate.

15. The display apparatus of claim 12, wherein the TFT layer comprises:

a first conductive layer connecting at least one gate of a TFT from among the plurality of TFTs to a respective second gate via hole from among the plurality of second gate via holes; and a second conductive layer connecting at least one drain of a TFT from among the plurality of TFTs to a respective second drain via hole from among the plurality of second drain via holes.

16. The display module of claim 12, wherein the plurality of first drain via holes are arranged in one column on the transparent display substrate, and wherein the plurality of second drain via holes are arranged alternatingly on opposite sides of the one column of the plurality of first drain via holes.

17. The display module of claim 16, wherein the plurality of second drain via holes are arranged such that a distance from each second drain via hole from among the plurality of second drain via holes to the one column of the plurality of first drain via holes is proportional to a distance of the second drain via hole to the center of the substrate.

* * * * *